(12) United States Patent
Miyamoto (10) Patent No.: US 10,514,787 B2
(45) Date of Patent: Dec. 24, 2019

(54) METHOD FOR MANUFACTURING CONDUCTOR FOR TOUCH PANEL, CONDUCTIVE FILM LAMINATE, AND CONDUCTOR FOR TOUCH PANEL

(71) Applicant: FUJIFILM Corporation, Tokyo (JP)

(72) Inventor: Haruhiko Miyamoto, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 100 days.

(21) Appl. No.: 15/807,998

(22) Filed: Nov. 9, 2017

(65) Prior Publication Data
US 2018/0067573 A1 Mar. 8, 2018

Related U.S. Application Data

(63) Continuation of application No. PCT/JP2016/053794, filed on Feb. 9, 2016.

(30) Foreign Application Priority Data

Jun. 11, 2015 (JP) .................................. 2015-118340

(51) Int. Cl.
*G06F 3/041* (2006.01)
*H05K 3/00* (2006.01)
*H05K 3/28* (2006.01)

(52) U.S. Cl.
CPC .......... *G06F 3/041* (2013.01); *H05K 3/0014* (2013.01); *H05K 3/28* (2013.01);
(Continued)

(58) Field of Classification Search
CPC .......... G06F 3/041; G06F 2203/04103; G06F 2203/04112; H05K 1/119; H05K 3/0014;
(Continued)

(56) References Cited

U.S. PATENT DOCUMENTS

| | | | | |
|---|---|---|---|---|
| 4,564,408 A | * | 1/1986 | Crumbach | ............ B29C 43/021 156/212 |
| 8,808,483 B2 | * | 8/2014 | Sung | ................. B32B 17/10036 156/214 |

(Continued)

FOREIGN PATENT DOCUMENTS

| | | |
|---|---|---|
| JP | 3-286848 A | 12/1991 |
| JP | 2010-267607 A | 11/2010 |

(Continued)

OTHER PUBLICATIONS

Japanese Office Action, dated Jul. 3, 2018, for Japanese Application No. 2017-523124, with an English Translation.

(Continued)

*Primary Examiner* — Mihir K Rayan
(74) *Attorney, Agent, or Firm* — Birch, Stewart, Kolasch & Birch, LLP (57) ABSTRACT

The conductor for a touch panel is manufactured by forming, on an insulating transparent cover member, at least one the thickness changed part obtained by changing a thickness of a portion to be deformed during forming with respect to a thickness of other portion in advance, forming a conductive film laminate by disposing a conductive member on a surface of the cover member, and performing collective forming into a three-dimensional shape such that the conductive film laminate is deformed at a portion where the thickness changed part is formed.

16 Claims, 6 Drawing Sheets

(52) U.S. Cl.
CPC .............. *G06F 2203/04103* (2013.01); *G06F 2203/04112* (2013.01); *H05K 2203/085* (2013.01); *H05K 2203/302* (2013.01)

(58) Field of Classification Search
CPC ........... H05K 3/28; H05K 2201/09736; H05K 2203/0278; H05K 2203/085; H05K 2203/302
See application file for complete search history.

(56) References Cited

U.S. PATENT DOCUMENTS

| | | | | |
|---|---|---|---|---|
| 10,078,388 | B2* | 9/2018 | Song | ..................... G06F 3/0412 |
| 2009/0277578 | A1* | 11/2009 | Sung | ..................... B32B 37/003 |
| | | | | 156/285 |
| 2010/0103138 | A1* | 4/2010 | Huang | ................... G06F 3/044 |
| | | | | 345/174 |
| 2012/0218219 | A1* | 8/2012 | Rappoport | .......... H01L 27/3276 |
| | | | | 345/174 |
| 2015/0077949 | A1* | 3/2015 | Baek | ...................... H01L 24/73 |
| | | | | 361/749 |
| 2015/0185888 | A1 | 7/2015 | Sakashita et al. | |
| 2016/0009056 | A1 | 1/2016 | Watanabe et al. | |
| 2017/0136727 | A1* | 5/2017 | Miyamoto | ................ B32B 7/02 |
| 2018/0371619 | A1* | 12/2018 | Tsukamoto | ............. B32B 15/04 |

FOREIGN PATENT DOCUMENTS

| | | |
|---|---|---|
| JP | 2013-257796 A | 12/2013 |
| JP | 5646795 B1 | 12/2014 |
| WO | WO 2013/035276 A1 | 3/2013 |

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2016/053794, dated Dec. 21, 2017, with English translation of the Written Opinion.

International Search Report (Form PCT/ISA/210) for International Application No. PCT/JP2016/053794, dated Apr. 26, 2016, with English translation.

* cited by examiner

METHOD FOR MANUFACTURING CONDUCTOR FOR TOUCH PANEL, CONDUCTIVE FILM LAMINATE, AND CONDUCTOR FOR TOUCH PANEL

CROSS-REFERENCE TO RELATED APPLICATIONS

This application is a Continuation of PCT International Application No. PCT/JP2016/53794, filed on Feb. 9, 2016, which claims priority under 35 U.S.C. § 119(a) to Japanese Patent Application No. 2015-118340, filed on Jun. 11, 2015. Each of the above application(s) is hereby expressly incorporated by reference, in its entirety, into the present application.

BACKGROUND OF THE INVENTION

1. Field of the Invention

The invention relates to a method for manufacturing a conductor for a touch panel, and particularly relates to a method for manufacturing a conductor for a touch panel having a three-dimensional shape.

The invention also relates to a conductive film laminate and a conductor for a touch panel.

2. Description of the Related Art

In recent years, touch panels which are used in combination with display devices such as liquid crystal display devices and perform an input operation to an electronic device by coming into contact with a screen, in various electronic devices such as portable information devices have come into wide use. In addition, the touch panels of the related art have a plane shape, however, along with the development of these electronic devices, the development of a touch panel that can be used by being formed into a three-dimensional shape is underway.

For example, in JP2013-257796A, a method for manufacturing a touch panel including forming a conductive film laminate formed of an insulating support and a conductive film into a three-dimensional hemispherical shape is disclosed. By using a touch panel manufactured by this manufacturing method in an electronic device, the screen of the electronic device attains a three-dimensional shape, and performing an input operation by coming into contact with the three-dimensional screen becomes possible.

SUMMARY OF THE INVENTION

However, as shown in JP2013-257796A, in a case where the conductive film laminate is formed into a three-dimensional shape, a tensile force or a compressive force acts on the peripheral part of the portion that is bent during the forming, and the thickness of the support of the conductive film laminate may partially change. In a case where the thickness of the support partially changes, variation in the thickness of the support may occur.

Since the sensitivity of the touch panel changes with the thickness of the insulating support, variation may occur in the sensitivity of the manufactured touch panel in a case where there is a variation in the thickness of the support, even if the touch panel is manufactured in a manner that is disclosed in JP2013-257796A.

The invention is made to address the aforementioned problems of the related art and an object thereof is to provide a method for manufacturing a conductor for a touch panel of which the sensitivity is stabilized by having a substantially even thickness, even in the case of being formed into a three-dimensional shape.

The invention also provides a conductive film laminate for the method for manufacturing a conductor for a touch panel.

The invention further provides a conductor for a touch panel obtained by the method for manufacturing a conductor for a touch panel.

A method for manufacturing a conductor for a touch panel according to the invention is a method for manufacturing a conductor for a touch panel, in which a conductive member is disposed on a surface of an insulating transparent cover member and then the conductive member and the cover member are collectively formed into a three-dimensional shape, the method comprising: forming, on the cover member, at least one thickness changed part obtained by changing a thickness of a portion to be deformed during the forming with respect to a thickness of other portion in advance; forming a conductive film laminate by disposing the conductive member on the surface of the cover member; and manufacturing a three-dimensional conductor for a touch panel by deforming the conductive film laminate at a portion where the thickness changed part is formed.

A conductive film laminate according to the invention is a conductive film laminate for manufacturing a conductor for a touch panel by being formed into a three-dimensional shape, the laminate comprising: an insulating transparent cover member having at least one thickness changed part obtained by changing a thickness of a portion to be deformed during the forming with respect to a thickness of other portion in advance; and a conductive member disposed on a surface of the cover member.

In the thickness changed part, a portion at which a thickness of the cover member decreases by the deformation during the forming desirably has a thickness greater than the thickness of the other portion which is not to be deformed, and a portion at which the thickness of the cover member increases by the deformation during the forming desirably has a thickness smaller than the thickness of the other portion which is not to be deformed.

Furthermore, the thickness of the cover member in the thickness changed part is desirably 0.5 to 3 times the thickness of the cover member after being formed into the conductor for a touch panel.

In a case where the forming is performed by a deep drawing process, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed may be disposed on the upper surface part.

Furthermore, the thickness changed part having a thickness smaller than the thickness of the other portion which is not to be deformed may be disposed in a region including a boundary part where the side surface part and the lower surface part intersect with each other.

In a case where the forming is performed by vacuum forming, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed may be disposed in a region including the side surface part and a boundary part where the side surface part and the lower surface part intersect with each other.

The conductive film laminate further comprises: a transparent insulating substrate which has the conductive member formed on the surface thereof, in which the insulating substrate is bonded onto the surface of the cover member through a transparent adhesive.

Furthermore, the conductive member can be directly formed on the surface of the cover member.

The conductive member can include a plurality of detection electrodes that have a mesh pattern formed of thin metal wires.

The cover member may have a flat first surface on which the conductive member is disposed and a second surface of which a surface height changes in the thickness changed part with respect to the other portion.

The conductor for a touch panel according to the invention is a conductor for a touch panel which has a three-dimensional shape, the conductor comprising: a bent part; a plane part; an insulating transparent cover member; and a conductive member disposed on the surface of the cover member, in which a thickness of the cover member in the bent part is 0.6 to 1.4 times a thickness of the cover member in the plane part.

According to the invention, with the method for manufacturing a conductor for a touch panel, at least one thickness changed part which is obtained by changing a thickness of a portion to be deformed during forming with respect to a thickness of other portion in advance is formed on the cover member, the conductive film laminate is formed by disposing the conductive member on the surface of the cover member, and the conductive film laminate is deformed at the portion where the thickness changed part is formed so as to form the laminate into a three-dimensional shape, and thus, a conductor for a touch panel of which the thickness can be substantially even and the sensitivity is stabilized can be manufactured.

DESCRIPTION OF THE PREFERRED EMBODIMENTS

Hereinafter, embodiments of the invention will be described based on the accompanying drawings.

Embodiment 1

A method for manufacturing a conductor for a touch panel according to Embodiment 1 is a method for manufacturing a three-dimensional conductor for a touch panel by bonding a conductive film onto a surface of a cover member where at least one thickness changed part is formed by partially changing a thickness of the cover member in advance so as to form a conductive film laminate and collectively forming the conductive film laminate.

By forming such a thickness changed part on the cover member in advance, the thickness of the cover member can be compensated even in a case where the thickness of the cover member partially changes during forming, and the thickness of the cover member can be substantially even after the forming.

First, a cover member used in the method for manufacturing a conductor for a touch panel according to Embodiment 1 will be described.

Figure 1:
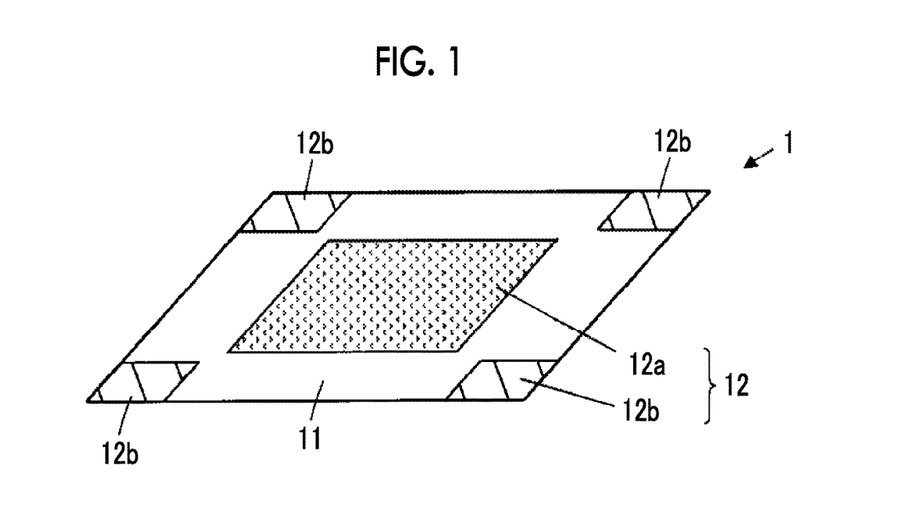
FIG. 1 is a perspective view of a cover member for a method for manufacturing a conductor for a touch panel according to Embodiment 1 of the invention.

FIG. 1 is a perspective view showing a cover member 1 used in the method for manufacturing a conductor for a touch panel according to Embodiment 1. The cover member 1 is used for forming by a deep drawing process, a thickness changed part is formed thereon in advance, and the cover member is transparent and has insulating properties. A conductive film is bonded onto the cover member, and can be collectively formed.

As shown in FIG. 1, the cover member 1 has a rectangular shape, and in a region including a rectangular center and regions including four corners, thickness changed parts 12 of which the thickness is changed with respect to the thickness of other portion 11, which is not these regions, are formed in advance.

The regions in which the thickness changed parts 12 are formed correspond to portions where the cover member 1 is deformed during the forming by the deep drawing process. On the other hand, the other portion 11 corresponds to a portion where the amount of deformation of the cover member 1 during the forming is negligibly small.

The thickness changed parts 12 consist of a thick thickness changed part 12a that is disposed in the region including the rectangular center and has a thickness greater than the thickness of the other portion 11 and thin thickness changed parts 12b that are disposed in the regions including the four rectangular corners and have a thickness smaller than the thickness of the other portion 11. The region where the thick thickness changed part 12a is disposed corresponds to a portion on which a tensile force acts during the forming by the deep drawing process, and the regions where the thin thickness changed parts 12b are disposed correspond to portions on which a compressive force acts, respectively.

Since a portion near the periphery of the cover member 1 is cut off during the manufacturing of the conductor for a touch panel, it is also possible to dispose the thick thickness changed part 12a only in a region including at least the rectangular center, without disposing the thin thickness changed parts 12b at the four rectangular corners.

It is desirable that the thickness changed parts 12 are precisely formed on the cover member 1, and for such precise formation, compression forming or injection compression forming is preferable. In addition, as forming material of the cover member 1, polycarbonate (PC), a cycloolefin polymer (COP), or an acrylic resin can be used.

Next, a conductive film 2 that is used for forming the conductive film laminate by being bonded onto the cover member 1 on which the thickness changed parts 12 are formed in advance will be described.

Figure 2:
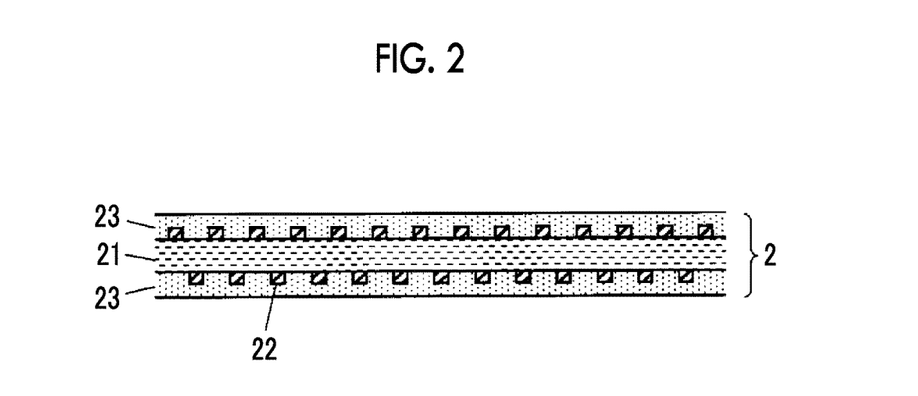
FIG. 2 is a cross sectional view showing a conductive film.

As shown in FIG. 2, in the conductive film 2, conductive members 22 are respectively formed on both surfaces of a flexible and transparent insulating substrate 21, and transparent protective layers 23 are formed on both surfaces of the insulating substrate 21 so as to cover the conductive members 22.

Figure 3:
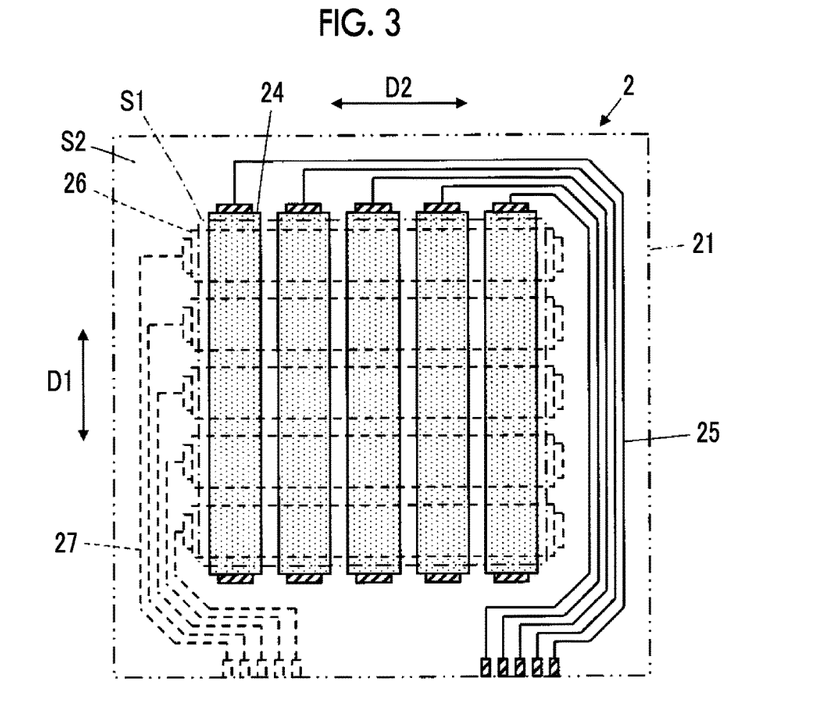
FIG. 3 is a plan view showing the conductive film.

As shown in FIG. 3, the conductive film 2 is partitioned into a sensing area S1, and a peripheral area S2 which is on the outer side of the sensing area S1. On the front surface of the insulating substrate 21, a plurality of first detection electrodes 24 which are respectively extended along a first direction D1 and disposed in parallel with a second direction D2 orthogonal to the first direction D1 are formed in the sensing area S1, and a plurality of first peripheral wirings 25 connected to the plurality of first detection electrodes 24 are arranged to be adjacent to each other in the peripheral area S2.

In the same manner as described above, on the rear surface of the insulating substrate 21, a plurality of second detection electrodes 26 which are respectively extended along the second direction D2 and disposed in parallel with the first direction D1 are formed in the sensing area S1, and a plurality of second peripheral wirings 27 connected to the plurality of second detection electrodes 26 are arranged to be adjacent to each other in the peripheral area S2.

Figure 4:
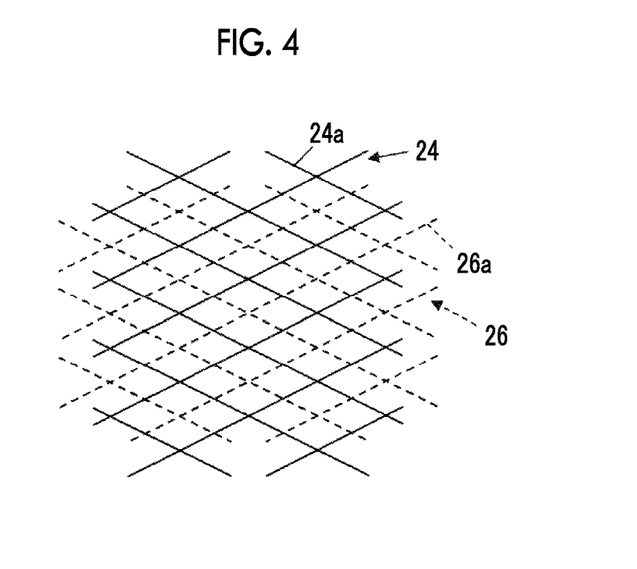
FIG. 4 is a partial plan view showing detection electrodes of the conductive film.

In addition, as shown in FIG. 4, the first detection electrode 24 disposed on the front surface of the insulating substrate 21 is formed with a mesh pattern formed of thin metal wires 24a and the second detection electrode 26 disposed on the rear surface of the insulating substrate 21 is formed with a mesh pattern formed of thin metal wires 26a.

The conductive film 2 is manufactured by forming the conductive members 22 including the first detection electrodes 24 and the first peripheral wirings 25 on the front surface of the insulating substrate 21, forming the conductive members 22 including the second detection electrodes 26 and the second peripheral wirings 27 on the rear surface of the insulating substrate 21, and forming the transparent protective layers 23 on both surfaces of the insulating substrate 21 so as to cover these conductive members 22.

A formation method of the conductive members 22 is not particularly limited. As disclosed in paragraphs <0067> to <0083> of JP2012-185813A, for example, the conductive members 22 can be formed by exposing a photosensitive material including an emulsion layer containing photosensitive silver halide salt to light to perform a development process.

The conductive members 22 can also be formed by respectively forming metal foils on the front surface and the rear surface of the insulating substrate 21 and printing a resist on each metal foil in a pattern shape or exposing and developing a resist applied to the entire surface for patterning, and etching the metal of openings. In addition, a method of printing a paste containing fine particles of a material configuring the conductive members 22 on the front surface and the rear surface of the insulating substrate 21 and performing metal plating with respect to the paste, a method using an ink jet method of using an ink including fine particles of a material configuring the conductive members 22, a method of forming an ink including fine particles of a material configuring the conductive members 22 by screen printing, a method of forming a resin including grooves on the insulating substrate 21 and applying conductive ink onto the grooves, or a micro-contact print patterning method can be used.

Here, as an example, a method of manufacturing a conductive film by exposing a photosensitive material including an emulsion layer containing photosensitive silver halide salt to light to perform a development process will be described.

(Preparation of Silver Halide Emulsion)

Amounts of a 2 solution and a 3 solution below corresponding to 90% were added to a 1 solution below held at 38° C. and pH of 4.5 for 20 minutes while being stirring, and nuclear particles having a diameter of 0.16 μm were formed. Then, a 4 solution and a 5 solution below were added thereto for 8 minutes, and the amounts of the remaining 10% of the 2 solution and the 3 solution below were added thereto for 2 minutes, and the particles were caused to grow to have a diameter of 0.21 μm. 0.15 g of potassium iodide was added thereto, aging was performed for 5 minutes, and particle formation was finished.

1 solution:
Water: 750 ml
Gelatin: 9 g
Sodium chloride: 3 g
1,3-dimethylimidazolidine-2-thione: 20 mg
Sodium benzenethiosulfonate: 10 mg
Citric acid: 0.7 g
2 solution:
Water: 300 ml
Silver nitrate: 150 g
3 solution:
Water: 300 ml
Sodium chloride: 38 g
Potassium bromide: 32 g
Potassium hexachloroiridate (III) (0.005% of KCl and 20% of aqueous solution): 8 ml
Ammonium hexachlororhodate (0.001% of NaCl and 20% of aqueous solution): 10 ml
4 solution:
Water: 100 ml
Silver nitrate: 50 g
5 solution:
Water: 100 ml
Sodium chloride: 13 g
Potassium bromide: 11 g
Yellow prussiate of potash: 5 mg After that, washing was performed using a flocculation method according to the usual method. Specifically, the temperature was decreased to 35° C. and pH was decreased using sulfuric acid until silver halide is precipitated (pH was in a range of 3.6±0.2). Then, approximately 3 liters of the supernatant was removed (first washing). After adding 3 liters of distilled water, sulfuric acid was added until silver halide is precipitated. 3 liters of the supernatant was removed again (second washing). The same operation as the second washing was further repeated one more time (third washing) and a washing and desalting step was finished. The pH of the emulsion after washing and desalting was adjusted to 6.4 and the pAg thereof was adjusted to 7.5, 3.9 g of gelatin, 10 mg of sodium benzenethiosulfonate, 3 mg of sodium benzenethiosulfinate, 15 mg of sodium thiosulfate, and 10 mg of chloroauric acid were added thereto, chemo-sensitization was performed so as to obtain optimal sensitivity at 55° C., 100 mg of 1,3,3a,7-tetraazaindene as a stabilizer and 100 mg of PROXEL (product name, manufactured by ICI Co., Ltd.) as a preservative were added thereto. The emulsion finally obtained was an iodide salt silver bromide cubic grain emulsion containing 0.08 mol % of silver iodide, in which a proportion of silver chlorobromide was set so that a proportion of silver chloride is 70 mol % and a proportion of silver bromide is 30 mol %, an average particle diameter is 0.22 μm, and a coefficient of variation is 9%.

(Preparation of Composition for Forming Photosensitive Layer)

$1.2 \times 10^{-4}$ mol/mol Ag of 1,3,3a,7-tetraazaindene, $1.2 \times 10^{-2}$ mol/mol Ag of hydroquinone, $3.0 \times 10^{-4}$ mol/mol Ag of citric acid, and 0.90 g/mol Ag of 2,4-dichloro-6-hydroxy-1,3,5-triazine sodium salt were added to the emulsion described above, the pH of the coating solution was adjusted to 5.6 using citric acid, and a composition for forming a photosensitive layer was obtained.

(Photosensitive Layer Formation Step)

After performing corona discharge treatment with respect to an insulating substrate, a gelatin layer having a thickness of 0.1 μm as an undercoat was provided on both surfaces of the insulating substrate, and an antihalation layer containing a dye which has an optical density of approximately 1.0 and is decolored due to alkali of a developer was further provided on the undercoat. The composition for forming a photosensitive layer was applied onto the antihalation layer, a gelatin layer having a thickness of 0.15 μm was further provided, and the insulating substrate including photosensitive layers formed on both surfaces thereof was obtained. The insulating substrate including photosensitive layers formed on both surfaces thereof is set as a film A. Regarding the photosensitive layers formed, an amount of silver was 6.0 g/m² and an amount of gelatin was 1.0 g/m².

(Exposure and Development Step)

The exposure of both surfaces of the film A was performed using parallel light using a high pressure mercury lamp as a light source through a photo mask corresponding to the pattern of the conductive members 22. After the exposure, the development was performed using a developer below and a fixing process was performed using a fixing solution (product name: N3X—R for CN16X manufactured by Fujifilm Corporation). Then, the insulating substrate was rinsed with pure water and dried, and accordingly, an insulating substrate in which conductive members 22 formed of Ag wires and gelatin layers are formed on both surfaces was obtained. The gelatin layers were formed between the Ag wires. The film obtained was set as a film B.

(Composition of Developer)

The following compounds are included in 1 liter (L) of the developer.

Hydroquinone: 0.037 mol/L
N-methylaminophenol: 0.016 mol/L
Sodium metaborate: 0.140 mol/L
Sodium hydroxide: 0.360 mol/L
Sodium bromide: 0.031 mol/L
Potassium metabisulfite: 0.187 mol/L (Heating Step)

The film B was placed in a superheated vapor tank at 120° C. for 130 seconds to perform the heating process. The film after the heating process was set as a film C.

(Gelatin Decomposing Process)

The film C was dipped in an aqueous solution of a proteolytic enzyme (BIOPLASE AL-15FG manufactured by Nagase ChemteX Corporation) (concentration of proteolytic enzyme: 0.5% by mass, solution temperature: 40° C.) for 120 seconds. The film C was extracted from the aqueous solution and dipped in warm water (solution temperature: 50° C.) for 120 seconds, and then washed. The film after the gelatin decomposing process was set as a film D. The film D was set as the conductive film 2.

Next, a method of forming the conductive film laminate by bonding the conductive film 2 manufactured as described above onto the surface of the cover member 1 will be described.

Figure 5:
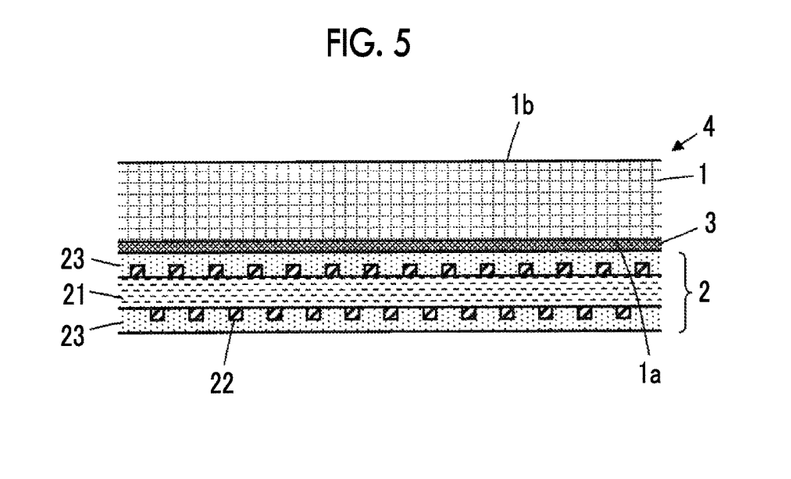
FIG. 5 is a cross sectional view showing a conductive film laminate.

As shown in FIG. 5, a conductive film laminate 4 is formed by bonding the conductive film 2 onto a first surface 1a of the cover member 1 with a transparent adhesive 3. The first surface 1a is formed to be flat, in order to increase reliability in bonding of the conductive film 2 onto the cover member 1. On the other hand, a second surface 1b of the cover member 1 which is disposed on the side opposite to the first surface 1a is roughly flat. However, in the thickness changed parts 12 shown in FIG. 1, the surface height changes with respect to the other portion 11, and thus, partial thickness change in the thickness changed parts 12 is realized.

In this way, the conductive film 2 is bonded onto the surface of the cover member 1, and thus the conductive members 22 formed on both surfaces of the insulating substrate 21 are disposed on the surface of the cover member 1.

Next, a method of manufacturing a three-dimensional conductor for a touch panel by performing collective forming by a deep drawing process on the conductive film laminate 4 formed as described above will be described.

Figure 6A:
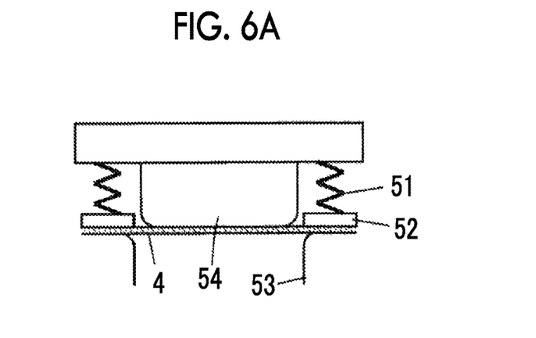
FIGS. 6A and 6B are cross sectional views for explaining a deep drawing process.
Figure 6B:
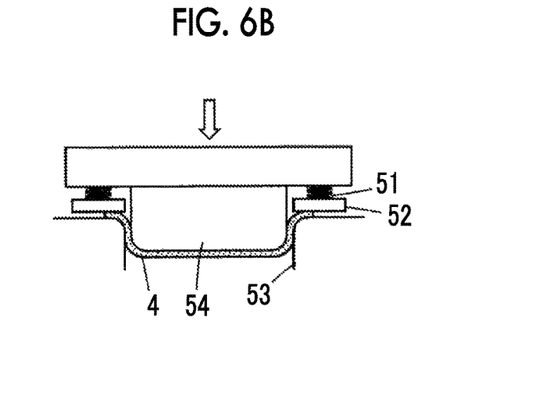
Figure 7:
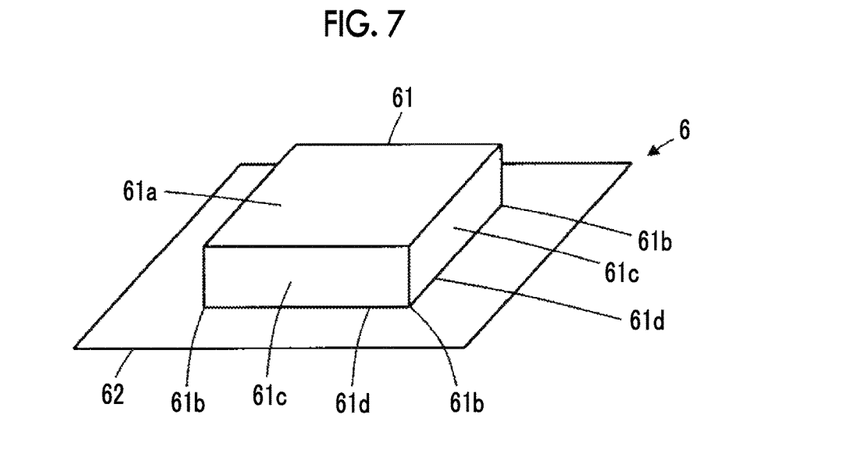
FIG. 7 is a perspective view showing a formed conductive film laminate.

First, a formed conductive film laminate 6 shown in FIG. 7 is manufactured by performing the deep drawing process using a press forming machine as shown in FIGS. 6A and 6B, in which an upper die 54 is pressed down in a state where the conductive film laminate 4 is lightly pressed between blank holders 52 and lower dies 53 by springs 51, to the extent that a wrinkle is not generated in the peripheral part. A formed portion 61 formed into a rectangular column including a rectangular upper surface and a lower surface part 62 which is disposed on a periphery of the formed portion 61 are formed in the formed conductive film laminate 6.

Here, an upper surface part 61a disposed on the upper surface of the formed portion 61 corresponds to the thick thickness changed part 12a shown in FIG. 1, and regions including four intersection points 61b where four corners of the formed portion 61 and the lower surface part 62 intersect with each other and four corners of the lower surface part 62 correspond to the thin thickness changed parts 12b shown in FIG. 1. On the other hand, the portion other than the portions that correspond to the thick thickness changed part 12a and the thin thickness changed parts 12b corresponds to the other portion 11 shown in FIG. 1.

Since the thick thickness changed part 12a corresponds to a portion that deforms such that the thickness of the cover member 1 decreases during the forming by the deep drawing process, the thick thickness changed part 12a has a thickness greater than that of the other portion 11 where the amount of deformation is negligibly small.

When the conductive film laminate 4 is formed, a tensile force acts on the upper surface part 61a, and thus deformation occurs such that the thickness of the cover member 1 in the upper surface part 61a decreases. However, since the deformation occurs such that the thickness of the cover member 1 in the thick thickness changed part 12a decreases, the upper surface part 61a has a thickness approximately equal to the thickness of the other portion 11 after the forming.

Since the thin thickness changed parts 12b correspond to portions that deform such that the thickness of the conductive film laminate 4 increases during the forming by the deep drawing process, the thin thickness changed parts 12b have a thickness smaller than that of the other portion 11 where the amount of deformation is negligibly small.

When the conductive film laminate 4 is formed, a compressive force acts on regions including the four intersection points 61b where the four corners of the formed portion 61 and the lower surface part 62 intersect with each other and the four corners of the lower surface part 62, and thus deformation occurs such that the thickness of the cover member 1 in these regions increases. However, since the deformation occurs such that the thickness of the cover member 1 in the thin thickness changed parts 12b corresponding to these regions increases, the lower surface part 62 in these regions has a thickness approximately equal to the thickness of the other portion 11 after the forming.

In this way, the cover member 1 of the formed conductive film laminate 6 after the forming by the deep drawing process has a substantially even thickness.

Figure 8:
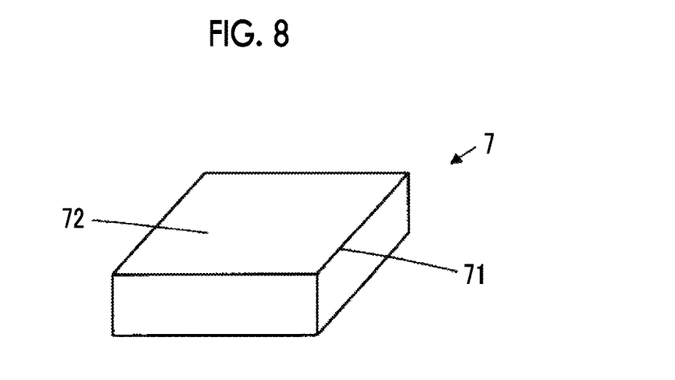
FIG. 8 is a perspective view showing a conductor for a touch panel.

Thereafter, a conductor for a touch panel 7 having a rectangular columnar shape as shown in FIG. 8 is manufactured by cutting off the lower surface part 62 from the formed conductive film laminate 6.

At this time, a bent part 71 and a plane part 72 are formed in the conductor for a touch panel 7, and it is desirable that the thickness of the cover member 1 in the bent part 71 is 0.6 to 1.4 times the thickness of the cover member 1 in the plane part 72.

The reason for this is that the sensitivity of the conductor for a touch panel changes with the thickness of the cover member, and thus, in a case where the thickness of the cover member 1 is out of this range, variation in the sensitivity of the conductor for a touch panel 7 may occur.

Furthermore, before the forming, it is desirable that the thickness of the cover member 1 in the thickness changed parts 12 consisting of the thick thickness changed part 12a and the thin thickness changed parts 12b as shown in FIG. 1 is a thickness that is 0.5 to 3 times the thickness of the cover member 1 of the conductor for a touch panel 7 after the forming.

The reason for this is that in a case where the thickness of the cover member 1 in the thickness changed parts 12 is out of this range, the thickness of the cover member 1 of the conductor for a touch panel 7 after the forming may not be substantially even causing variation to occur, and variation in sensitivity of the conductor for a touch panel 7 may occur.

In the conductor for a touch panel 7 manufactured as described above, since the cover member 1 has a substantially even thickness even after the forming by the deep drawing process, the sensitivity of the conductor is stable, and performing an operation with high reliability becomes possible.

Embodiment 2

Figure 9:
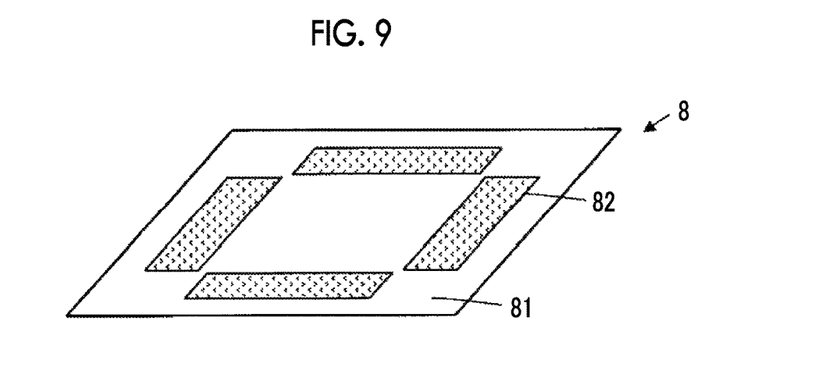
FIG. 9 is a perspective view showing a cover member for a method for manufacturing a conductor for a touch panel according to Embodiment 2.

The configuration of a cover member 8 for a method for manufacturing a conductor for a touch panel according to Embodiment 2 is shown in FIG. 9. The cover member 8 forms a conductive film laminate by being bonded onto a conductive film, and the conductive film laminate is collectively formed by vacuum forming so as to manufacture a three-dimensional conductor for a touch panel, and thus the cover member is transparent and has insulating properties.

In addition, the cover member 8 has a rectangular shape, and in four regions that extend in parallel with each side of the rectangle and partially surround the center of the rectangle, thickness changed parts 82 having a thickness greater than that of other portion 81 which is a portion other than the regions is formed. Similar to the cover member 1 of Embodiment 1, a first surface onto which the conductive film is bonded is formed to be flat on the cover member 8, and the surface height of a second surface, which is on a side opposite to the first surface, changes in the thickness changed parts 82 with respect to the other portion 81.

Next, a conductive film laminate is formed by bonding a conductive film 2 onto the surface of the cover member 8 with a transparent adhesive 3. By bonding the conductive film 2 onto the surface of the cover member 8 as described above, conductive members 22 formed on both surfaces of an insulating substrate 21 are disposed on the surface of the cover member 8.

The conductive film 2 and the adhesive 3 are the same as the conductive film 2 and the adhesive 3 used in Embodiment 1.

Next, a method for manufacturing a three-dimensional conductor for a touch panel in which the conductive film laminate formed as described above is collectively subjected to vacuum forming will be described.

Figure 10A:
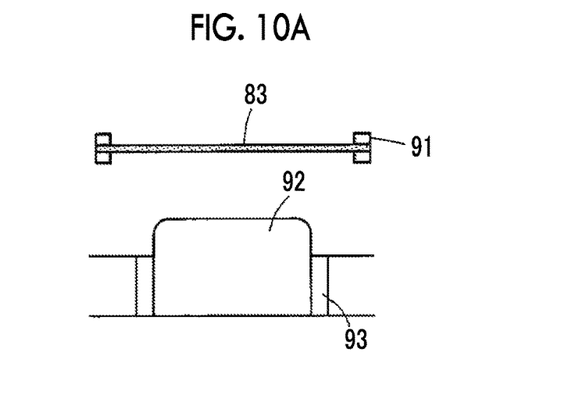
FIGS. 10A and 10B are cross sectional views for explaining vacuum forming.
Figure 10B:
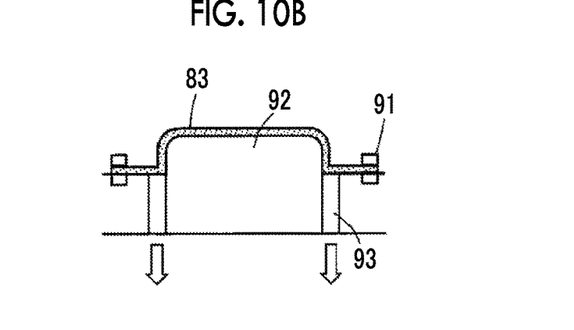

By using a vacuum forming machine shown in FIGS. 10A and 10B, clamping frames 91 are pressed down, and a conductive film laminate 83 is pressed onto a male die 92, in a state where the conductive film laminate 83 is fixed between the clamping frames 91. Then, the vacuum forming is performed on the conductive film laminate 83 by rendering the space between the conductive film laminate 83 and the male die 92 vacuum by exhausting air through exhaust ports 93 and closely attaching the conductive film laminate 83 to the male die 92, thereby producing a formed conductive film laminate 6 as shown in FIG. 7. A formed portion 61 which is formed into a rectangular column including a rectangular upper surface and a lower surface part 62 which is disposed on a periphery of the formed portion 61 are formed on the formed conductive film laminate 6.

Here, parts of side surface parts 61c disposed on four side surfaces of the formed portion 61 correspond to the thickness changed parts 82 shown in FIG. 9. Since the thickness changed parts 82 correspond to the portions that deform such that the thickness of the conductive film laminate 83 decreases during the forming by the vacuum forming, the thickness changed parts 82 have a thickness greater than that of the other portion 81 where the amount of deformation during the forming is negligibly small.

When the conductive film laminate 83 is formed, a tensile force acts on parts of the side surface parts 61c, and thus deformation occurs such that the thickness of the cover member 8 in the parts of side surface parts 61c decreases. However, since the deformation occurs such that the thickness of the cover member 8 in the thickness changed parts 82 decreases, the parts of side surface parts 61c have a thickness approximately equal to the thickness of the other portion 81 after the forming.

Furthermore, regions including parts of four boundary parts 61d where the four side surface parts 61c and the lower surface part 62 intersect with each other also correspond to the thickness changed parts 82 shown in FIG. 9, and have a thickness greater than that of the other portion 81 where the amount of deformation during the forming is negligibly small. In addition, since the tensile force acts on the regions during the forming, deformation occurs such that the thickness of the cover member 8 in these regions decreases. However, since the thickness of the cover member 8 in the thickness changed parts 82 decreases, the lower surface part 62 in these regions has a thickness approximately equal to the thickness of the other portion 81 after the forming.

In this way, the formed conductive film laminate 6 after the vacuum forming has a substantially even thickness.

Thereafter, a conductor for a touch panel 7 having a rectangular columnar shape as shown in FIG. 8 is manufactured by cutting off the lower surface part 62 from the formed conductive film laminate 6.

In the conductor for a touch panel 7 manufactured as described above, since the cover member 8 has a substantially even thickness even after the forming by the vacuum forming, the sensitivity of the conductor is stable, and performing an operation with high reliability becomes possible.

In Embodiments 1 and 2 above, the conductors for a touch panel 7 having the rectangular columnar shape including a rectangular upper surface are manufactured, but there is no limitation. In the same manner as described above, a conductor for a touch panel having a rectangular columnar shape including a polygonal upper surface which is a triangle, a pentagon, or more, a conductor for a touch panel having a cylindrical shape including a circular upper surface, and a conductor for a touch panel having a columnar shape including an upper surface having another shape can also be manufactured.

In addition, in Embodiments 1 and 2 above, the plurality of first detection electrodes 24 and first peripheral wirings 25 are disposed on the front surface of the insulating substrate 21, and the plurality of second detection electrodes 26 and the second peripheral wirings 27 are disposed on the rear surface of the insulating substrate 21, but there is no limitation.

For example, the plurality of first detection electrodes 24 and the plurality of second detection electrodes 26 can be disposed on one surface side of the insulating substrate 21 through an interlayer insulating film, and the first peripheral wirings 25 and the second peripheral wirings 27 can be disposed on the same surface side of the insulating substrate 21.

Furthermore, a two-substrate configuration may be adopted. That is, the plurality of first detection electrodes 24 and the first peripheral wirings 25 can be disposed on the front surface of a first insulating substrate, and the plurality of second detection electrodes 26 and the second peripheral wirings 27 may be disposed on the front surface of a second insulating substrate. The first insulating substrate and the second insulating substrate can be superimposed with each other to be used.

It is also possible to form the conductive members 22 such as the plurality of first detection electrodes 24 and the plurality of second detection electrode 26 directly on the surface of the cover member 1 or 8, without bonding the conductive film 2 onto the cover member 1.

EXAMPLES

Figure 11:
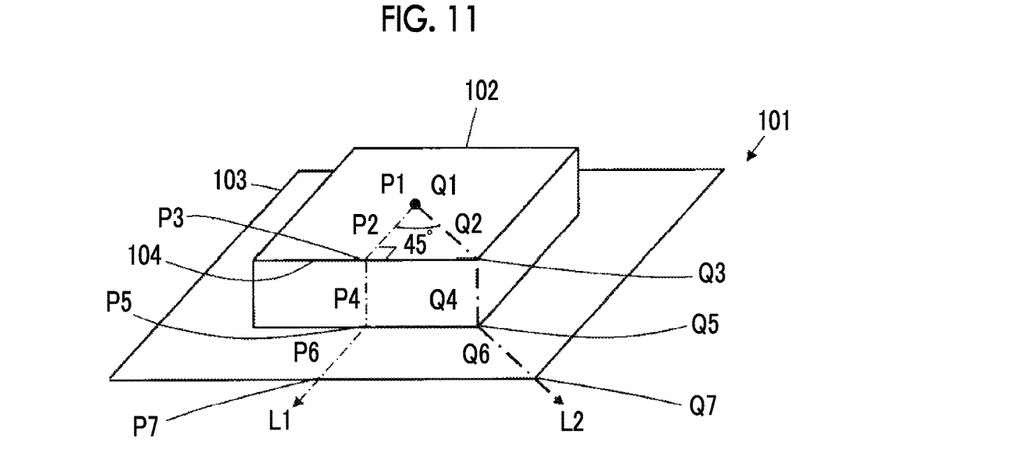
FIG. 11 is a view showing a part where a thickness of the cover member is measured after forming.

FIG. 11 shows a formed conductive film laminate 101 obtained by bonding a transparent conductive film not shown in the drawing onto a surface of a transparent insulating cover member with an adhesive and forming the laminate into a rectangular columnar shape. The formed conductive film laminate 101 has a formed portion 102 formed into a rectangular columnar shape by the forming and a lower surface part 103 which is disposed on a periphery of the formed portion 102.

A line which is orthogonal to one side 104 of a rectangular upper surface part of the formed portion 102 from the center of the upper surface part is referred to as a measurement line L1. Similarly, a line which crosses one side 104 of the upper surface part with an angle of 45 degrees from the center of the upper surface part is referred to as a measurement line L2.

Comparative Example 1

A conductive film laminate obtained by bonding a conductive film onto a flat cover member was formed into a rectangular columnar shape by a deep drawing process without forming a thickness changed part on the cover member, the cover member was peeled off from a formed conductive film laminate, and a measurement test was performed by measuring the thickness of the cover member at measurement points P1 to P7 along a measurement line L1 and at measurement points Q1 to Q7 along a measurement line L2 by a micrometer.

Here, a biaxial stretching polyethylene terephthalate (PET) film having a thickness of 100 μm was used as the conductive film, polycarbonate (PC) having a thickness of 500 μm was used as the cover member, and a conductive film laminate was formed by bonding the conductive film onto the cover member using an optically clear adhesive sheet (OCA) 8172CL manufactured by 3M. The conductive film laminate was formed to have a rectangular columnar shape having a size with a length of 70 mm, a width of 70 mm, and a height of 10 mm by the deep drawing process.

The thickness of the cover member peeled off from the formed conductive film laminate after the forming in Comparative Example 1 was measured. The results shown in Table 1 were obtained.

TABLE 1

| Comparative Example 1 | | | | | | | |
|---|---|---|---|---|---|---|---|
| Measurement point in L1 direction | Thickness of cover member [μm] | | Percent change [%] with respect to target thickness (500 μm) | Measurement point in L2 direction | Thickness of cover member [μm] | | Percent change [%] with respect to target thickness (500 μm) |
| | Before forming | After forming | | | Before forming | After forming | |
| P1 | 495 | 450 | −10% | Q1 | 495 | 445 | −11% |
| P2 | 494 | 445 | −11% | Q2 | 494 | 443 | −12% |
| P3 | 493 | 450 | −10% | Q3 | 493 | 398 | −21% |
| P4 | 495 | 488 | −2% | Q4 | 495 | 488 | −2% |
| P5 | 493 | 495 | −1% | Q5 | 493 | 591 | 18% |

TABLE 1-continued

| | Comparative Example 1 | | | | | | |
|---|---|---|---|---|---|---|---|
| Measurement point in L1 direction | Thickness of cover member [μm] | | Percent change [%] with respect to target thickness (500 μm) | Measurement point in L2 direction | Thickness of cover member [μm] | | Percent change [%] with respect to target thickness (500 μm) |
| | Before forming | After forming | | | Before forming | After forming | |
| P6 | 495 | 499 | 0% | Q6 | 495 | 585 | 17% |
| P7 | 494 | 499 | 0% | Q7 | 494 | 580 | 16% |

In the measurement results in Table 1, a target thickness refers to a target value of a thickness of the cover member after the forming, and specifically, the target thickness is 500 μm. As for a percent change with respect to the target thickness, how much greater the thickness of the cover member has become after the forming compared to the target thickness is indicated as a positive value, and how much smaller the thickness of the cover member has become after the forming compared to the target thickness is indicated as a negative value.

From Table 1, it was confirmed that the percent changes of the thickness of the cover member after the forming with respect to the target thickness were approximately −11% at the measurement points P1 to P3 in a measurement line L1 direction. From these results, it is thought that a strong tensile force acted on the measurement points P1 to P3, and deformation occurred such that the thickness of the cover member decreased. On the other hand, the percent changes with respect to the target thickness were approximately −2% at the measurement points P4 to P7, and it is thought that there was no strong force acting on these points, and the amount of deformation was negligibly small.

Similarly, it was confirmed that the minimum percent changes with respect to the target thickness were approximately −21% at the measurement points Q1 to Q3 in a measurement line L2 direction. From these results, it is thought that a strong tensile force acted on the measurement points Q1 to Q3, and deformation occurred such that the thickness of the cover member decreased.

It was also confirmed that the percent changes with respect to the target thickness were approximately 18% at the measurement points Q5 to Q7. From these results, it is thought that a strong compressive force acted on the measurement points Q5 to Q7, and deformation occurred such that the thickness of the cover member increased. On the other hand, the percent change with respect to the target thickness was approximately −2% at the measurement point Q4, and it is thought that there was no strong force acting on this point, and the amount of deformation was negligibly small.

Figure 12:
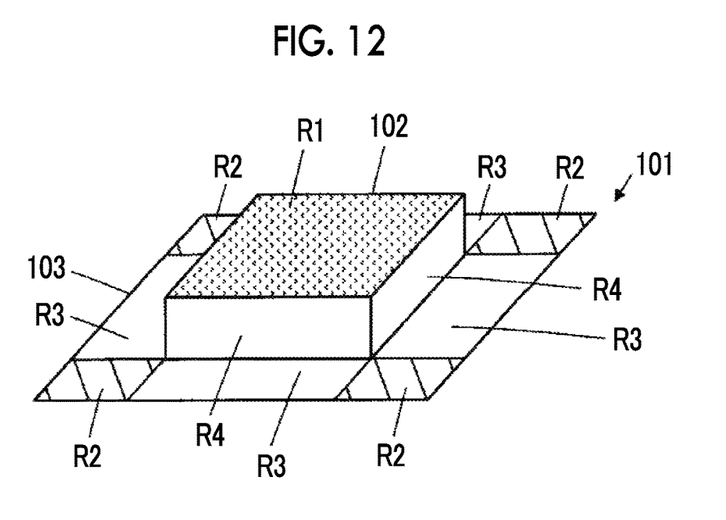
FIG. 12 is a view showing a part where a thickness changed part is formed in a case of forming by the deep drawing process.

Here, as shown in FIG. 12, a region corresponding to the upper surface part of the formed portion 102 formed on the formed conductive film laminate 101 which is formed by the deep drawing process is referred to as R1, and regions including four intersection points at which four corners of the formed portion 102 and the lower surface part 103 intersect with each other and four corners of the lower surface part 103 are referred to as R2. Furthermore, regions on the lower surface part 103 other than the region R2 are referred to as R3, and regions corresponding to four side surfaces of the formed portion 102 are referred to as R4.

The region R1 includes the measurement points P1 to P3 in the measurement line L1 direction and the measurement points Q1 to Q3 in the measurement line L2 direction, the region R2 includes the measurement points Q5 to Q7, the region R3 includes the measurement points P5 to P7, and the region R4 includes the measurement points P4 and Q4.

Example 1

A thick thickness changed part having a thickness greater than that of other portion where the amount of deformation during forming was negligibly small was formed on a cover member in a portion corresponding to a region R1 in advance.

A conductive film laminate was formed in the same manner as in Comparative Example 1, except for forming the thick thickness changed part on the cover member in the portion corresponding to the region R1, the laminate was formed into a rectangular columnar shape by the deep drawing process, the cover member was peeled off from a formed conductive film laminate, and the thickness of the cover member was measured.

The thickness of the cover member peeled off from the formed conductive film laminate after the forming in Example 1 was measured. The results shown in Table 2 were obtained.

TABLE 2

| | Example 1 | | | | | | |
|---|---|---|---|---|---|---|---|
| Measurement point in L1 direction | Thickness of cover member [μm] | | Percent change [%] with respect to target thickness (500 μm) | Measurement point in L2 direction | Thickness of cover member [μm] | | Percent change [%] with respect to target thickness (500 μm) |
| | Before forming | After forming | | | Before forming | After forming | |
| P1 | 551 | 490 | −2% | Q1 | 551 | 496 | −1% |
| P2 | 552 | 493 | −1% | Q2 | 552 | 495 | −1% |
| P3 | 550 | 500 | 0% | Q3 | 618 | 494 | −1% |
| P4 | 495 | 485 | −3% | Q4 | 495 | 485 | −3% |
| P5 | 493 | 497 | −1% | Q5 | 493 | 589 | 18% |

TABLE 2-continued

Example 1

| Measurement point in L1 direction | Thickness of cover member [μm] | | Percent change [%] with respect to target thickness (500 μm) | Measurement point in L2 direction | Thickness of cover member [μm] | | Percent change [%] with respect to target thickness (500 μm) |
|---|---|---|---|---|---|---|---|
| | Before forming | After forming | | | Before forming | After forming | |
| P6 | 493 | 499 | 0% | Q6 | 493 | 590 | 18% |
| P7 | 495 | 497 | −1% | Q7 | 495 | 583 | 17% |

From Table 2, it was confirmed that the percent changes of the thickness of the cover member after the forming with respect to the target thickness were approximately −3% at measurement points P1 to P7 in a measurement line L1 direction. It was also confirmed that the percent changes with respect to the target thickness were −1% at measurement points Q1 to Q3 in a measurement line L2 direction.

From these results, it is thought that a tensile force acted on the thick thickness changed part formed in a portion corresponding to the region R1 including the measurement points P1 to P3 and Q1 to Q3, and deformation occurred such that the thickness of the cover member in this portion decreased, and the cover member in this portion had a thickness that was equal to the thickness of the other portion where the amount of deformation was negligibly small.

It was also confirmed that the percent changes with respect to the target thickness were approximately −3% in a region R3 including the measurement points P5 to P7 and in a region R4 including measurement points P4 and Q4. From these results, it is thought that the amount of deformation of the cover member was negligibly small in the regions R3 and R4, in a case of the forming by the deep drawing process.

In this manner, it was confirmed that forming the thick thickness changed part at least on the portion corresponding to the region R1 in advance allows the cover member in the formed portion 102 including the regions R1 and R4 to have a substantially even thickness after the forming by the deep drawing process.

On the other hand, it was confirmed that the percent changes with respect to the target thickness were approximately 18% in a region R2 including the measurement points Q5 to Q7, which were the same as the measurement results in Table 1 shown in Comparative Example 1. However, as shown in Embodiments 1 and 2, by cutting off the lower surface part 103 including the measurement points P5 to P7 and Q5 to Q7 in the case of the forming so as to manufacture a conductor for a touch panel shown in FIG. 8 using the formed portion 102, a conductor for a touch panel including the cover member having a substantially even thickness can be obtained.

Example 2

Thin thickness changed parts having a thickness smaller than that of other portion where amount of deformation was negligibly small were formed on the cover member shown in Example 1, in portions corresponding to regions R2 of the lower surface part 103.

A conductive film laminate was formed in the same manner as in Example 1, except for forming the thin thickness changed parts on the cover member in the portions corresponding to the regions R2, the laminate was formed into a rectangular columnar shape by the deep drawing process, the cover member was peeled off from a formed conductive film laminate, and the thickness of the cover member was measured.

As shown in Table 2 of Example 1, it was confirmed that the percent changes with respect to the target thickness were approximately −3% at all of the measurement points P1 to P7 in a measurement line L1 direction, indicating that the amount of deformation was negligibly small, and, since the region R2 did not include the measurement points P1 to P7, measurement in the measurement line L1 direction was omitted in Example 2.

The thickness of the cover member peeled off from the formed conductive film laminate after the forming in Example 2 was measured. The results shown in Table 3 were obtained.

TABLE 3

Example 2

| Measurement point in L2 direction | Thickness of cover member [μm] | | Percent change [%] with respect to target thickness (500 μm) |
|---|---|---|---|
| | Before forming | After forming | |
| Q1 | 550 | 495 | −1% |
| Q2 | 551 | 494 | −1% |
| Q3 | 620 | 496 | −1% |
| Q4 | 500 | 495 | −1% |
| Q5 | 410 | 492 | −2% |
| Q6 | 412 | 482 | −4% |
| Q7 | 411 | 484 | −3% |

From Table 3, it was confirmed that that the percent changes of the cover member after the forming with respect to the target thickness were approximately −4% in measurement points Q1 to Q7 in a measurement line L2 direction. From these results, it is thought that a compressive force acted on the thin thickness changed parts formed in the portions corresponding to the regions R2 including the measurement points Q5 to Q7, deformation occurred such that the thickness of the cover member in these portions increased, and the cover member in these portions had a thickness equal to that of the other portion where the amount of deformation was negligibly small.

It was confirmed that the percent changes with respect to the target thickness were approximately −1% at the measurement points Q1 to Q4, which were the same as the measurement results in Table 2 shown in Example 1.

In this manner, it was confirmed that forming the thick thickness changed part in the portion of the cover member corresponding to the region R1 and forming the thin thickness changed parts in the portion of the cover member corresponding to the regions R2 in advance allow the cover member in the entirety of the formed conductive film laminate 101 to have a substantially even thickness after the forming by the deep drawing process.

In the case of being compared with Example 1, since the cover member in the entirety of the formed conductive film laminate 101 has a substantially even thickness, there are advantages in that not only the formed portion 102, but also the lower surface part 103 can be used as a conductor for a touch panel, and conductors for a touch panel having a wider range of three-dimensional shapes can be manufactured.

In the same manner as in Example 1, it is also possible to use only the formed portion 102 as the conductor for a touch panel after removing the lower surface part 103.

Comparative Example 2

A measurement test was conducted by performing forming by vacuum forming on a conductive film laminate obtained by bonding a conductive film onto the flat cover member showing in Comparative Example 1.

A conductive film laminate was formed in the same manner as in Comparative Example 1, except for forming the conductive film laminate by the vacuum forming, the cover member was peeled off from a formed conductive film laminate, and the thickness of the cover member was measured.

Figure 13:
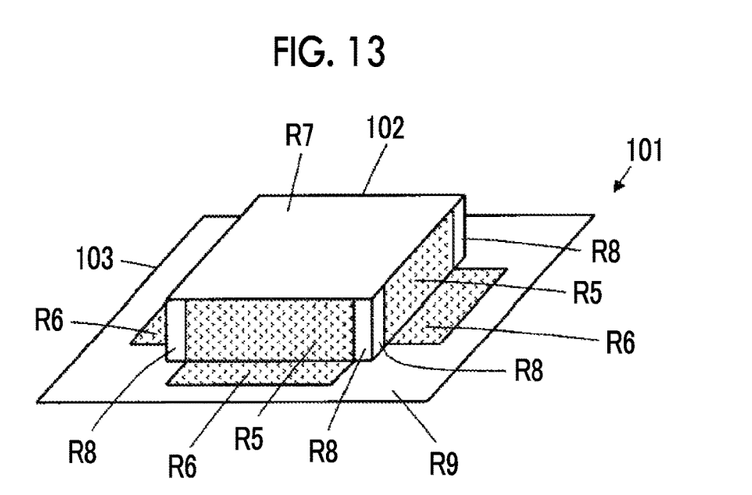
FIG. 13 is a view showing a part where a thickness changed part is formed in a case of forming by the vacuum forming.

The thickness of the cover member peeled off from the formed conductive film laminate after the forming in Comparative Example 2 was measured. The results shown in Table 4 were obtained.

a region corresponding to an upper surface part of the formed portion 102 is referred to as R7, regions on the four side surface parts of the formed portion 102 other than the regions R5 are referred to as R8, and a region on the lower surface part 103 other than the regions R6 is referred to as R9.

The region R5 includes the measurement point P4, and the region R6 includes the measurement points P5 and P6. In addition, the region R7 includes the measurement points P1 to P3 and Q1 to Q3, the region R8 includes the measurement point Q4, and the region R9 includes the measurement points P7 and Q4 to Q7.

Example 3

Thick thickness changed parts having a thickness greater than that of other portion where the amount of deformation was negligibly small were formed on a cover member in advance in portions corresponding to regions R5 and in portions corresponding to regions R6.

A conductive film laminate was formed in the same manner as in Comparative Example 2, except for forming the thick thickness changed parts on the cover member in the portions corresponding to the regions R5 and portions corresponding to the regions R6, the cover member was peeled off from a formed conductive film laminate, and the thickness of the cover member was measured.

TABLE 4

| | Comparative Example 2 | | | | | | |
|---|---|---|---|---|---|---|---|
| Measurement point in L1 direction | Thickness of cover member [μm] | | Percent change [%] with respect to target thickness (500 μm) | Measurement point in L2 direction | Thickness of cover member [μm] | | Percent change [%] with respect to target thickness (500 μm) |
| | Before forming | After forming | | | Before forming | After forming | |
| P1 | 499 | 497 | −1% | Q1 | 494 | 495 | −1% |
| P2 | 495 | 496 | −1% | Q2 | 493 | 493 | −1% |
| P3 | 497 | 495 | −1% | Q3 | 495 | 497 | −1% |
| P4 | 495 | 310 | −38% | Q4 | 494 | 496 | −1% |
| P5 | 496 | 312 | −38% | Q5 | 494 | 499 | 0% |
| P6 | 495 | 404 | −19% | Q6 | 496 | 501 | 0% |
| P7 | 497 | 496 | −1% | Q7 | 495 | 497 | −1% |

From Table 4, it was confirmed that the minimum percent changes of the thickness of the cover member after the forming with respect to the target thickness were approximately −38% at measurement points P4 to P6 in a measurement line L1 direction. From these results, it is thought that a strong tensile force acted on the measurement points P4 to P6, and deformation occurred such that the thickness of the cover member decreased. On the other hand, the percent changes with respect to the target thickness were approximately −1% at measurement points P1 to P3 and P7 and at all of the measurement points Q1 to Q7 in a measurement line L2 direction, and it is thought that there was no strong force acting on these points, and the amount of deformation was negligibly small.

Here, as shown in FIG. 13, regions corresponding to parts of four side surface parts of the formed portion 102 formed on the formed conductive film laminate 101 formed by the vacuum forming are referred to as R5, and regions including parts of boundary parts at which the four side surface parts the formed portion 102 and the lower surface part 103 intersect with each other are referred to as R6. In addition, As shown in Table 4 of Comparative Example 2, since it was confirmed that the amount of deformation of the cover member was negligibly small in the case of the vacuum forming at all measurement points Q1 to Q7 in a measurement line L2 direction, measurement in the measurement line L2 direction was omitted.

The thickness of the cover member peeled off from the formed conductive film laminate after the forming in Example 3 was measured. The results shown in Table 5 were obtained.

TABLE 5

| Example 3 | | | |
|---|---|---|---|
| Measurement point in L1 direction | Thickness of cover member [μm] | | Percent change [%] with respect to target thickness (500 μm) |
| | Before forming | After forming | |
| P1 | 498 | 496 | −1% |
| P2 | 496 | 495 | −1% |
| P3 | 497 | 494 | −1% |

TABLE 5-continued

Example 3

| Measurement point in L1 direction | Thickness of cover member [μm] | | Percent change [%] with respect to target thickness (500 μm) |
|---|---|---|---|
| | Before forming | After forming | |
| P4 | 784 | 499 | 0% |
| P5 | 785 | 501 | 0% |
| P6 | 785 | 505 | 1% |
| P7 | 495 | 496 | −1% |

From Table 5, it was confirmed that the percent changes of the thickness of the cover member after the forming with respect to the target thickness were approximately ±1% at all measurement points P1 to P7 in a measurement line L1 direction. From these results, it is thought that a tensile force acted on the thick thickness changed parts formed in the portions corresponding to the region R5 and the region R6 including the measurement points P4 to P6, deformation occurred such that the thickness of the cover member in these portions decreased, and the cover member had a thickness equal to that of the other portion where the amount of deformation was negligibly small.

It was confirmed that the percent changes with respect to the target thickness were approximately −1% at the measurement points P1 to P4 and P7, which were the same as the measurement results in Table 4 shown in Comparative Example 2.

In this manner, it was confirmed that forming the thick thickness changed parts in the portions of the cover member corresponding to the regions R5 and R6 in advance allow the cover member in the entirety of the formed conductive film laminate 101 to have a substantially even thickness after the forming by the vacuum forming.

In the case of being compared with Example 1, since the cover member in the entirety of the formed conductive film laminate 101 has a substantially even thickness, there are advantages in that not only the formed portion 102, but also the lower surface part 103 can be used as a conductor for a touch panel, and conductors for a touch panel having a wider range of three-dimensional shapes can be manufactured.

In the same manner as in Example 1, it is also possible to use only the formed portion 102 as the conductor for a touch panel after removing the lower surface part 103.

EXPLANATION OF REFERENCES 1, 8: cover member
1a: first surface
1b: second surface
11, 81: other portion
12, 82: thickness changed part
12a: thick thickness changed part
12b: thin thickness changed part
2: conductive film
21: insulating substrate
22: conductive member
23: protective layer
24: first detection electrode
24a, 26a: thin metal wire
25: first peripheral wiring
26: second detection electrode
27: second peripheral wiring
3: adhesive
4, 83: conductive film laminate
51: spring
52: blank holder
53: lower die
54: upper die
6, 101: formed conductive film laminate
61, 102: formed portion
61a: upper surface part
61b: intersection point
61c: side surface part
61d: boundary part
62, 103: lower surface part
7: conductor for touch panel
71: bent part
72: plane part
91: clamping frame
92: male die
93: exhaust port
104: side
S1: sensing area
S2: peripheral area
P1, P2, P3, P4, P5, P6, P7, Q1, Q2, Q3, Q4, Q5, Q6, Q7: measurement point
R1, R2, R3, R4, R5, R6, R7, R8, R9: region
L1, L2: measurement line
D1: first direction
D2: second direction

What is claimed is:

1. A method for manufacturing a conductor for a touch panel, in which a conductive member is disposed on a flat first surface of an insulating transparent cover member having the flat first surface and a second surface on the side opposite to the first surface and then the conductive member and the cover member are collectively formed into a three-dimensional shape, the method comprising:
    forming, on the cover member, at least one thickness changed part obtained by changing the thickness of a portion to be deformed during the forming by changing a surface height of the second surface of a portion to be deformed during the forming with respect to the second surface of other portion in advance;
    forming a conductive film laminate by disposing the conductive member on the first surface of the cover member; and
    manufacturing a three-dimensional conductor for a touch panel by deforming the conductive film laminate at a portion where the thickness changed part is formed.

2. A conductive film laminate for manufacturing a conductor for a touch panel by being formed into a three-dimensional shape, the laminate comprising:
    an insulating transparent cover member having a first surface and a second surface on the side opposite to the first surface and having at least one thickness changed part obtained by changing of the thickness of a portion to be deformed during a forming by changing a surface height of the second surface of a portion to be deformed during the forming with respect to the second surface of other portion in advance; and
    a conductive member disposed on the first surface of the cover member.

3. The conductive film laminate according to claim 2, wherein, in the thickness changed part, a portion at which a thickness of the cover member decreases by the deformation during the forming has a thickness greater than the thickness of the other portion which is not to be deformed, and a portion at which the thickness of the cover member increases by the deformation during the forming has a thickness smaller than the thickness of the other portion which is not to be deformed.

4. The conductive film laminate according to claim 3, wherein, in a case where the forming is performed by a deep drawing process, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed is disposed on the upper surface part.

5. The conductive film laminate according to claim 4, wherein the thickness changed part having a thickness smaller than the thickness of the other portion which is not to be deformed is disposed in a region including a boundary part where the side surface part and the lower surface part intersect with each other.

6. The conductive film laminate according to claim 3, wherein, in a case where the forming is performed by vacuum forming, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed is disposed in a region including the side surface part and a boundary part where the side surface part and the lower surface part intersect with each other.

7. The conductive film laminate according to claim 2, wherein the thickness of the cover member in the thickness changed part is 0.5 to 3 times the thickness of the cover member after being formed into the conductor for a touch panel.

8. The conductive film laminate according to claim 7, wherein, in a case where the forming is performed by a deep drawing process, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed is disposed on the upper surface part.

9. The conductive film laminate according to claim 8, wherein the thickness changed part having a thickness smaller than the thickness of the other portion which is not to be deformed is disposed in a region including a boundary part where the side surface part and the lower surface part intersect with each other.

10. The conductive film laminate according to claim 7, wherein, in a case where the forming is performed by vacuum forming, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed is disposed in a region including the side surface part and a boundary part where the side surface part and the lower surface part intersect with each other.

11. The conductive film laminate according to claim 2, wherein, in a case where the forming is performed by a deep drawing process, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed is disposed on the upper surface part.

12. The conductive film laminate according to claim 11, wherein the thickness changed part having a thickness smaller than the thickness of the other portion which is not to be deformed is disposed in a region including a boundary part where the side surface part and the lower surface part intersect with each other.

13. The conductive film laminate according to claim 2, wherein, in a case where the forming is performed by vacuum forming, a formed portion which is formed into a three-dimensional columnar shape and a lower surface part which is disposed on a periphery of the formed portion are formed, and the formed portion has an upper surface part and a side surface part connected to the upper surface part, the thickness changed part having a thickness greater than the thickness of the other portion which is not to be deformed is disposed in a region including the side surface part and a boundary part where the side surface part and the lower surface part intersect with each other.

14. The conductive film laminate according to claim 2, further comprising:
a transparent insulating substrate which has the conductive member formed on the surface thereof,
wherein the insulating substrate is bonded onto the first surface of the cover member through a transparent adhesive.

15. The conductive film laminate according to claim 14, wherein the conductive member includes a plurality of detection electrodes that have a mesh pattern formed of thin metal wires.

16. The conductive film laminate according to claim 2, wherein the conductive member is directly formed on the first surface of the cover member.

\* \* \* \* \*